United States Patent
Yue et al.

(10) Patent No.: US 7,256,121 B2
(45) Date of Patent: Aug. 14, 2007

(54) CONTACT RESISTANCE REDUCTION BY NEW BARRIER STACK PROCESS

(75) Inventors: Duofeng Yue, Plano, TX (US); Stephan Grunow, Dallas, TX (US); Satyavolu S. Papa Rao, Garland, TX (US); Noel M. Russell, Plano, TX (US); Montray Leavy, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/002,935

(22) Filed: Dec. 2, 2004

(65) Prior Publication Data

US 2006/0121724 A1 Jun. 8, 2006

(51) Int. Cl.
*H01L 21/4763* (2006.01)

(52) U.S. Cl. .......... 438/625; 438/695; 257/E21.161; 257/E21.17; 257/E21.169

(58) Field of Classification Search .......... 438/625, 438/640, 673, 695; 257/E21.161, E21.169, 257/E21.17
See application file for complete search history.

(56) References Cited

U.S. PATENT DOCUMENTS

| | | | |
|---|---|---|---|
| 5,460,689 A * | 10/1995 | Raaijmakers et al. | 438/713 |
| 5,652,464 A * | 7/1997 | Liao et al. | 257/751 |
| 5,654,233 A * | 8/1997 | Yu | 438/643 |
| 5,904,561 A * | 5/1999 | Tseng | 438/643 |
| 5,956,608 A * | 9/1999 | Khurana et al. | 438/627 |
| 6,156,664 A | 12/2000 | Gau | |
| 6,287,964 B1 * | 9/2001 | Cho | 438/643 |
| 6,440,289 B1 * | 8/2002 | Woo et al. | 205/103 |
| 7,071,096 B2 * | 7/2006 | Friedemann et al. | 438/627 |
| 7,214,619 B2 * | 5/2007 | Brown et al. | 438/681 |
| 2003/0034244 A1 * | 2/2003 | Yasar et al. | 204/192.3 |
| 2004/0063307 A1 * | 4/2004 | Karthikeyan et al. | 438/627 |
| 2004/0127014 A1 * | 7/2004 | Huang et al. | 438/627 |
| 2005/0056536 A1 * | 3/2005 | Gopalraja et al. | 204/192.12 |

OTHER PUBLICATIONS

U.S. Appl. No. 10/688,452 entitled "Stacked Interconnect Structure Between Copper Lines of a Semiconductor Circuit"; to Stephan Grunow, et al., currently pending.
U.S. Appl. No. 10/903,597 entitled "Dual Damascene Diffusion Barrier/ Liner Process With Selective Via-to-Trench-Bottom Recess"; to Satyavolu Srinivas Papa Rao, et al., currently pending.

* cited by examiner

*Primary Examiner*—Caridad Everhart
(74) *Attorney, Agent, or Firm*—Peter K. McLarty; W. James Brady, III; Frederick J. Telecky, Jr.

(57) ABSTRACT

The present invention provides a method for forming an interconnect on a semiconductor substrate 100. The method includes forming an opening 230 over an inner surface of the opening 130, the depositing forming a reentrant profile near a top portion of the opening 130. A portion of barrier 230 is etched, which removes at least a portion of the barrier 230 to reduce the reentrant profile. The etching also removes at least a portion of the barrier 230 layer at the bottom of the opening 130.

21 Claims, 3 Drawing Sheets

CONTACT RESISTANCE REDUCTION BY NEW BARRIER STACK PROCESS

TECHNICAL FIELD OF THE INVENTION

The present invention is directed, in general, to deposition of conducting films on a semiconductor substrate and, more specifically, to a method for deposition of barrier materials in contact holes to reduce the series resistance of the finished contact.

BACKGROUND OF THE INVENTION

Integrated circuits (ICs) are fabricated on wafers of a semiconductor material such as silicon. As many integrated circuit devices as possible are placed on the wafer to maximize the number of devices fabricated per wafer and reduce the cost per finished device.

The IC device contains semiconductor devices, such as transistors, capacitors and resistors, formed on the silicon substrate. The electrical connections used to hook up the semiconductor devices to form a working device are known in the art as "interconnects". Interconnects consist of metal lines formed in the plane of the substrate, and vias formed in the direction normal to the plane of the substrate. Several interconnect levels may be used in the IC, with highly integrated microprocessors using eight or more levels.

A special case of the via level is that level connecting the first metal level to the semiconductor devices. These vias are known as "contacts," and are formed by a process that is different than the vias between metal levels. Contacts are typically formed from tungsten, with certain layers lining the contact to getter contaminants, act as a barrier, and to form an ohmic contact to the semiconductor devices.

High quality contacts are essential to high device yield and reliability, but fabrication of these high quality contacts poses several technical challenges. For example, the contacts are designed to have a high ratio of the height to the diameter, known as the aspect ratio. High aspect ratio is a consequence of several constraints in the design of the IC. For example, it is desirable to achieve a high packing density of the contacts to enable high circuit density. This constrains the diameter of the contacts to be as small as possible. In addition, the dielectric separating the semiconductor devices from the first metal level must be thick enough to protect transistors from mobile metal ions. Moreover, the deepest contact is as deep as the sum of the thickness of the dielectric over the transistor and the height of the transistor gate over the semiconductor substrate. These constraints lead to contacts with aspect ratios large enough to present manufacturing challenges.

One such challenge is removing contaminants from the bottom of the contact hole before depositing one or more barrier layers into the hole. Contamination has the effect of increasing the contact resistance, $R_c$, of the contact and reducing device reliability. In conventional practice, the contamination is partially removed prior to deposition of one or more films by performing a presputter etch (PSE). The PSE is typically an argon plasma formed under conditions that favor the sputtering and ejection of material from the bottom of the contact hole. To some extent, however, the PSE also knocks dielectric material off the sidewall of the contact hole, which redeposits onto the bottom of the hole. Thus, there is a competition between removal of contamination from the bottom of the hole and redeposition of sidewall material. Proper design of the PSE process will minimize the net contamination at the bottom of the hole, but generally some contamination will remain, raising the contact resistance above the level that would otherwise be obtainable.

Another critical challenge is the ability to deposit continuous films into the contact hole. In conventional practice, a liner is deposited, followed by a barrier. The liner serves to getter contaminants and to promote adhesion of a barrier deposited over the liner. The liner films may be deposited using a physical deposition process such as Physical Vapor Deposition (PVD) or Ionized Metal Plasma (IMP) deposition. Such processes preferentially deposit onto the top surface of the dielectric, and to a lesser extent at the bottom of the contact hole. However, the deposited film thins out particularly on the sidewalls of the contact hole. Moreover, the thickness of the liner material deposited at the bottom of the contact hole decreases as the aspect ratio increases, leading to a risk of reduced effectiveness in the gettering of contaminants at the bottom of the contact hole.

Similar issues are confronted in obtaining continuous barrier coverage of the contact sidewalls. For some choices of liner material, a continuous barrier is critical to producing high quality devices with high yield. An example is the use of Ti as the liner, which will react with the tungsten precursor, typically $WF_6$, during contact formation if gaps in the barrier exist. This reaction results in yield-limiting defects and poor reliability.

Yet another critical manufacturing challenge is forming the contact plug without seams and voids. Contact seams can lead to increased contact resistance and decreased reliability. A tungsten CVD process is typically used to form the plug, and under appropriate conditions, seams and voids can form in the plug. These seams and voids will typically form when the contact hole has a reentrant profile, i.e., when the contact hole diameter increases with increasing depth of the hole, over at least a portion of the hole. Even if the contact sidewalls are not reentrant after the hole is formed, deposition of the liner can result in a shoulder of material at the top of the hole which results in the undesirable profile. The resolution of these manufacturing issues is critical to producing ICs with high yield to keep the manufacturing cost as low as possible.

Accordingly, what is needed is a method of forming contact liner and barrier layers which addresses the challenges outlined above.

SUMMARY OF THE INVENTION

To address the above-discussed deficiencies of the prior art, the present invention provides a method for forming an interconnect, an interconnect using the method, a method for forming an integrated circuit using the method, and another method for forming an interconnect. In one embodiment, the method of forming an interconnect includes forming an opening in a dielectric layer and depositing a liner over an inner surface of the opening. During the deposition a reentrant profile is formed near a top portion of the opening. A portion of the liner is etched, the etching removing at least a portion of the barrier to reduce the reentrant profile and removes at least a portion of the liner at the bottom of the opening.

In another embodiment, there is an interconnect for use in an integrated circuit, including a dielectric layer, a conductive layer located under the dielectric layer, and an interconnect structure located within the dielectric layer. The interconnect structure includes a conductive plug located within an opening located in the dielectric layer, with a liner located within the opening and between the conductive plug and the dielectric layer. A barrier is also located within the opening, between the conductive plug and the liner, with the barrier in contact with the conductive layer.

In yet another embodiment, a method for manufacturing an integrated circuit is provided, which includes forming transistors over a semiconductor substrate, and forming a first dielectric layer over the transistors. The method further includes forming an opening in the dielectric layer and depositing a liner over an inner surface of the opening. The deposition forms a reentrant profile near a top portion of the opening. A portion of the liner is etched, which removes at least a portion of the liner to reduce the reentrant profile. The etch also removes at least a portion of the liner at the bottom of the opening. Additional dielectric layers are formed over the first dielectric layer and interconnects are formed in the first dielectric layer and the additional dielectric layers to interconnect the transistors and thereby form an operative integrated circuit.

In still another embodiment, the method of forming an interconnect includes forming an opening in a dielectric layer over a conductive layer comprising a compound of a metal and a semiconductor, and depositing a substantially conformal liner over an inner surface of the opening. A portion of the liner is etched using a plasma, the etching removing at least a portion of the liner at the bottom of the opening.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
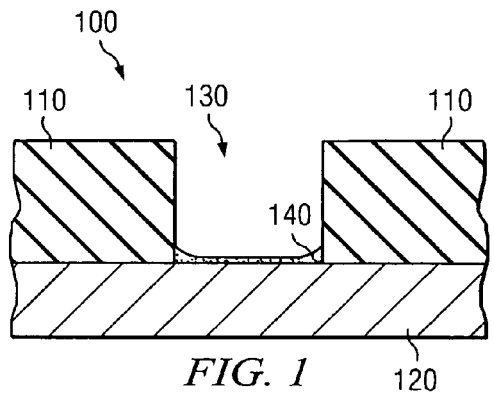
FIG. 1 illustrates a sectional view of a semiconductor substrate as it would appear at the beginning of processing according to the claimed invention.

Referring initially to FIG. 1, illustrated is a sectional view of a semiconductor device 100 at an early stage of manufacture. A dielectric layer 110 overlies conductive layer 120. Dielectric layer 110 may be a conventional dielectric used to space the semiconductor devices from the first interconnect level, such as phosphorous-doped silicon dioxide. However, the presently claimed invention is not limited to a particular dielectric and doping. Conductive layer 120 may also be formed conventionally, and further may be a metal silicide such as NiSi, though one skilled in the art will appreciate other compounds of a metal and semiconductor could also be used as the conductive layer. Opening 130 has been formed in dielectric 110 by conventional means, after which contamination 140 may be present at the bottom of the opening 130. The sidewalls of opening 130 are shown as substantially vertical. In practice, however, the sidewall may have some slope, with the width of opening 130 generally decreasing with increasing depth. Under some conditions, however, the sidewall profile may be reentrant over at least a portion of the sidewall.

Figure 2:
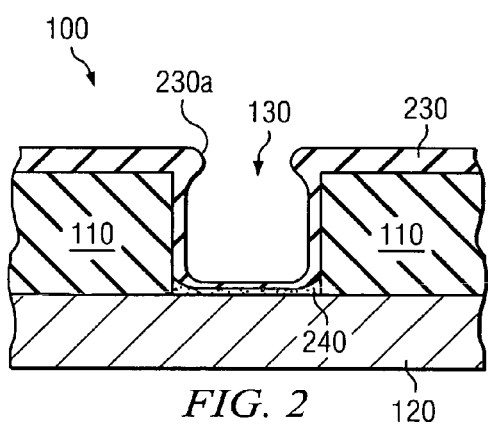
FIG. 2 illustrates a sectional view of a semiconductor substrate after deposition of the liner according to the claimed invention.

Turning now to FIG. 2 with continued reference to FIG. 1, in one embodiment of the present invention, a presputter etch (PSE) may be used to remove at least a portion of contamination 140. The PSE is a conventional process that uses an argon or other noble gas plasma to physically sputter material from the bottom of opening 130 and eject it to the processing chamber.

After the PSE, if used, a liner 230 is deposited onto the substrate. One of several deposition processes may be used, including PVD, CVD, and ALD. The choice of liner material is dictated by the overall scheme of forming the contact plug, and by the nature and degree of contamination resulting from the formation of the opening 130. The case of contamination that may be segregated by gettering will be considered first.

When the contamination 140 is of a form that it can be segregated, or "gettered" by a suitable material, then it may be desirable to use such a material for the liner 130. Suitable materials will be sufficiently reactive with the contamination to bind to it, forming a contaminated liner layer 240. In this case, the liner may be one of several suitable substantially pure metallic elements. In an advantageous embodiment of the invention, Ti is used as the material to form the liner 230. Other suitable materials that act as a getter may be used instead, such as Ta, Ru and Ir.

The choice of deposition process will affect both the thickness and topography of liner 230. When a CVD or ALD process is used, the resulting film is substantially conformal, and may be deposited to a thickness of 1-4 nm, with 2 nm being preferred, to obtain complete coverage of the sidewalls of opening 130. However, when a PVD process is used, the liner is deposited to a thickness between about 3 nm and about 15 nm, with about 8 nm being preferred, as measured on the horizontal surface of the substrate (the "field"). The thicker deposition is necessary because only a fraction of the PVD film will deposited onto the sidewall of opening 130. In addition to the preferential deposition on surfaces normal to the plasma flux, an inherent characteristic of the PVD process is the formation of a "shoulder" of material 230a at the top of opening 130 that acts to narrow the opening. This constriction of opening 130 is undesirable, as it results in a reentrant profile of the sidewall that may result in the formation of seams in the metal plug formed in the opening in a later process. This point will be returned to shortly.

Figure 3:
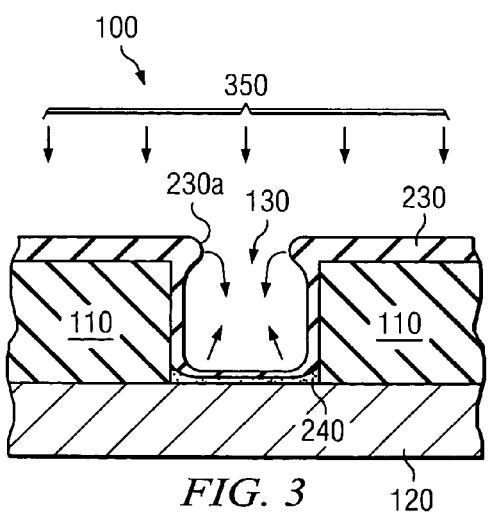
FIG. 3 illustrates a sectional view of a semiconductor substrate during sputter etch processing according to the claimed invention.

In an advantageous embodiment of the invention, the deposition of the liner 230 is followed by a post-sputter-etch (post-SE). This process step is depicted in FIG. 3. One purpose of the post-SE is to remove at least a portion of contaminated liner 240 from the bottom of opening 130. A noble gas is used to form a plasma, represented by flux lines 350, under conditions suitable to result in the etching of the liner 230 at the bottom of opening 130. In another embodiment, this etching results in exposing conductive layer 120 at the bottom of the opening 130. Exposing conductive layer 120 may additionally include removing a portion of conductive layer 120 such that the surface of this layer is recessed below the original level of the conductive layer 120.

A second purpose of the post-SE is to reduce any shoulder 230a that may be present at the top of opening 130. As mentioned previously, when a PVD process is used to deposit the liner 230, a shoulder 230a may form at the top of opening 130. The process conditions of the post-SE can be tailored to remove a portion of shoulder 230a, some of which is redeposited onto the sidewalls and bottom of opening 130. Because the post-SE process also removes material from the bottom of opening 130, a dynamic exchange of liner material results to replace the contaminated liner material with less contaminated material. Additionally, removing liner material from the top region of opening 130 reduces or eliminates the reentrant characteristic of the sidewall, resulting in reduction of seams in the finished contact.

These two effects are a significantly beneficial aspect of the invention. The presence of buried contamination in the finished contact increases the risk of a reduction of long-term device reliability. Furthermore, the contamination results in higher contact resistance of the finished contact (not shown), reducing device speed and increasing power dissipation and device temperature. To the extent that the contact resistance is lower, these undesirable effects of higher contact resistance will be reduced. Moreover, the reduction of the reentrant characteristic of the sidewall has the effect of reducing the degree to which seams form in the contact plug. Seams have the effect of increasing contact resistance, with the undesirable effects that result therefrom. Moreover, the seams also cause a severe reliability issue in copper damascene interconnects when the barrier associated with the first metal level loses continuity over the seam, allowing copper to migrate into it.

The post-SE process operates to remove material to some degree from the top and the bottom of opening 130. The degree to which bottom removal occurs can be varied by appropriate selection of process parameters. For the case in which the liner is conformal, an embodiment of the post-SE process that results in approximately equal removal from the top and bottom of the opening 130 is preferred. Plasma conditions that favor this result include a wafer bias power of between about 200 Watts and 500 Watts, an RF coil power between about 200 Watts and about 1500 Watts, a gas flow of Ar having a flow rate ranging from about 10 sccm to about 100 sccm, and a pressure of between about 2 mTorr and about 40 mTorr. For the case in which the liner deposition results in the formation of a shoulder at the top of opening 130, a post-SE process that favors removal from the top of opening 130 is an advantageous embodiment of the post-SE process. Plasma conditions in this embodiment include using a lower wafer bias power than in the above embodiment. Plasma conditions further include a wafer bias power of between about 100 Watts and 500 Watts, an RF coil power between about 200 Watts and about 1500 Watts, a gas flow of Ar having a flow rate ranging from about 10 sccm to about 100 sccm, and a pressure of between about 1 mTorr and about 30 mTorr. Alternate embodiments of these processes include using Xe and Ne as the plasma gas.

Referring back to FIGS. 1 and 2, when the contamination 130 is of a nature that gettering is not effective to aid in its removal, then non-metallic liner materials, as well as metallic liner materials, may be used for liner 230. Suitable nonmetallic materials include those comprising TaN, WN, MoN, TiCN, TaCN, WCN, MoCN, TiSiN, TaSiN, WSiN, and MoSiN, and may be formed using CVD or ALD processes. Those skilled in the art will appreciate that these chemical formulae are representative of the composition, and the stoichiometry of the deposited film may depart from an ideal stoichiometry. Additionally, such films may contain impurity atoms, such as hydrogen, as a byproduct of the deposition process. As discussed previously, these processes produce a substantially conformal liner 230, and do not result in the formation of shoulders 230a to a significant degree. In this case, the post-SE will be tailored to favor removal of material from the bottom of opening 130, and as before, may result in partial removal of the material at the bottom of the opening 130 or may further result in the exposure of conductive layer 120.

In yet another embodiment, the post-SE is performed simultaneously with the deposition of liner 230 by a PVD process. This is accomplished by using a DC target power of between about 5 kW and about 15 kW, simultaneously with wafer AC bias power of between about 100 W and about 500 W, during the deposition of liner 230. Optionally, an RF coil power of between about 200 W and about 1500 W may be simultaneously used during this deposition to improve plasma stability. In this embodiment, a separate post-SE after deposition of liner 230 is optional. Moreover, a second deposition of liner material after the simultaneous deposition and etch may optionally be performed.

Figure 4A:
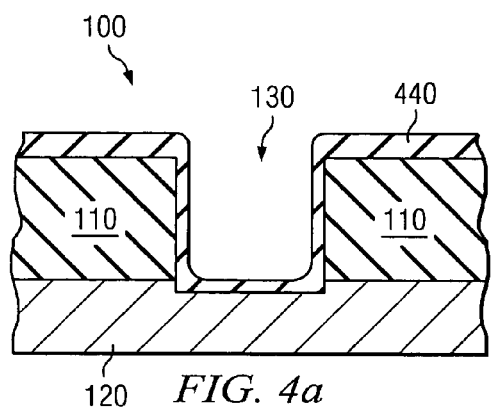
FIG. 4a illustrates a sectional view of a semiconductor substrate after completion of a post-deposition sputter etch process according to the claimed invention, for an embodiment that does not expose the underlying conductive layer.
Figure 4B:
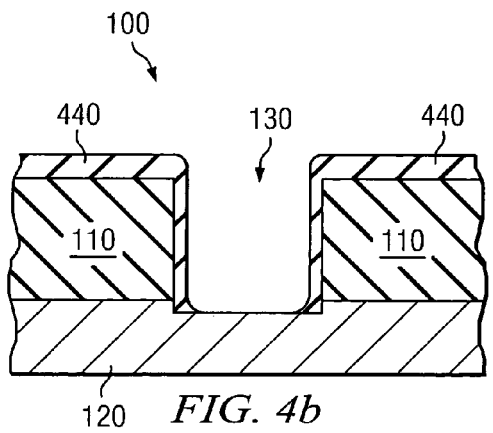
FIG. 4b illustrates a sectional view of a semiconductor substrate after completion of a post-deposition sputter etch process according to the claimed invention, for an embodiment that exposes the underlying conductive layer.

FIG. 4 depicts the profile of opening 130 and etched liner 440 after the post-SE. In FIG. 4a, the case in which conductive layer 120 is not exposed is shown, while the case in which this layer is exposed is shown in FIG. 4b.

Turning now to FIG. 5, a barrier 550 may be deposited over the etched liner 440. In embodiments of the invention in which a reaction between the contact precursor and the liner is not a concern, the use of a barrier 550 is optional. When a barrier 550 is used, an advantageous embodiment of the invention includes using a metal nitride, deposited by CVD, ALD, or PVD, such as TiN, though alternate embodiments include films comprising TaN, WN, MoN, TiCN, TaCN, WCN, MoCN, TiSiN, TaSiN, WSiN, and MoSiN. As before, the actual stoichiometry of these materials may depart from these ideal empirical formulae. In one embodiment, the barrier 550 is deposited by PVD to a thickness of between about 3 nm and about 15 nm, with about 8 nm preferred. In an alternate embodiment, the barrier 550 is deposited by CVD or ALD to a thickness of between about 1 nm and 4 nm, with 2 nm being preferred. In another alternate embodiment, the barrier 550 comprises Ta, Ru or Ir, deposited by ALD. In yet another alternate embodiment, the barrier 550 comprises Rh, Pd, Os or Pt, deposited by ALD. In both of these latter alternate embodiments, the barrier 550 is deposited to a thickness of between about 1 nm and 4 nm, with 2 nm being preferred.

Figures 5A, 5B:
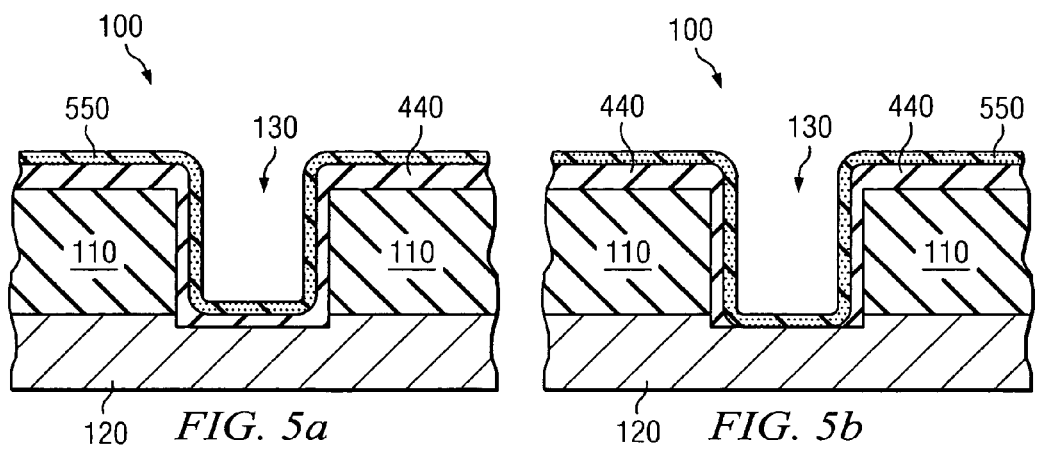
FIG. 5a illustrates a sectional view of a semiconductor substrate after deposition of a barrier according to the claimed invention, for an embodiment in which the post-deposition etch of the liner does not expose the underlying conductive layer.
FIG. 5b illustrates a sectional view of a semiconductor substrate after deposition of a barrier according to the claimed invention, for an embodiment in which the post-deposition etch of the liner exposes the underlying conductive layer.

FIG. 5a shows the case in which a barrier is deposited over the liner, and conductive layer 120 was not exposed during the post-SE process. In this case, both the liner 440 and barrier 550 are substantially continuous over the sidewalls and bottom of opening 130. In contrast, FIG. 5b shows the case in which conductive layer 120 was exposed during the post-SE process. In this case, barrier 550 is in direct contact with conductive layer 120, while both liner 440 and barrier 550 are substantially continuous on the sidewalls of opening 130. This embodiment is advantageous due to the elimination of an interface between conductive layer 120 and the metal plug formed in the opening 130 in a later process, resulting in lower resistance of the finished contact.

Figure 6:
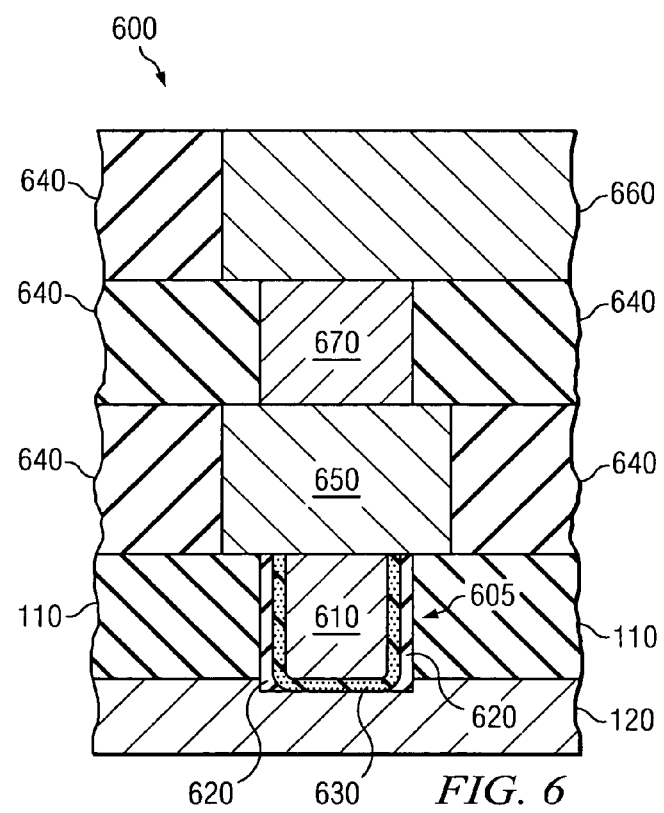
FIG. 6 illustrates a sectional view of an interconnect for use in an integrated circuit, in which the contact liner and barrier layers are processed according to the principles of the claimed invention.

FIG. 6 shows an exemplary sectional view of an interconnect 600 for use in an integrated circuit, in which the contact is formed according to the principles of the claimed invention. The contact 605 comprises metal plug 610, which may be tungsten or other suitable metal, liner 620, and barrier 630. In this embodiment, barrier 630 is in direct contact with conductive layer 120. Dielectric 110 separates conductive layer 120 from dielectric layer 640, which may in turn comprise one or more dielectric layers, including conventional dielectrics, low-k and ultra low-k materials, airgaps and barrier and etch stop dielectrics. The contact comprising metal plug 610, liner 620 and barrier 630 is electrically coupled to metal line 650. Metal line 650 is further electrically coupled to metal line 660 with via 670. Metal lines 650, 660 and via 670 may comprise copper, aluminum, or other metals and metallic compound appropriate to semiconductor interconnect fabrication. The illustrated embodiment has two metal interconnect levels. However, it will be immediately apparent to those skilled in the art that the present invention is applicable to interconnects using any number of levels, including those using the contact level for local interconnects.

Figure 7:
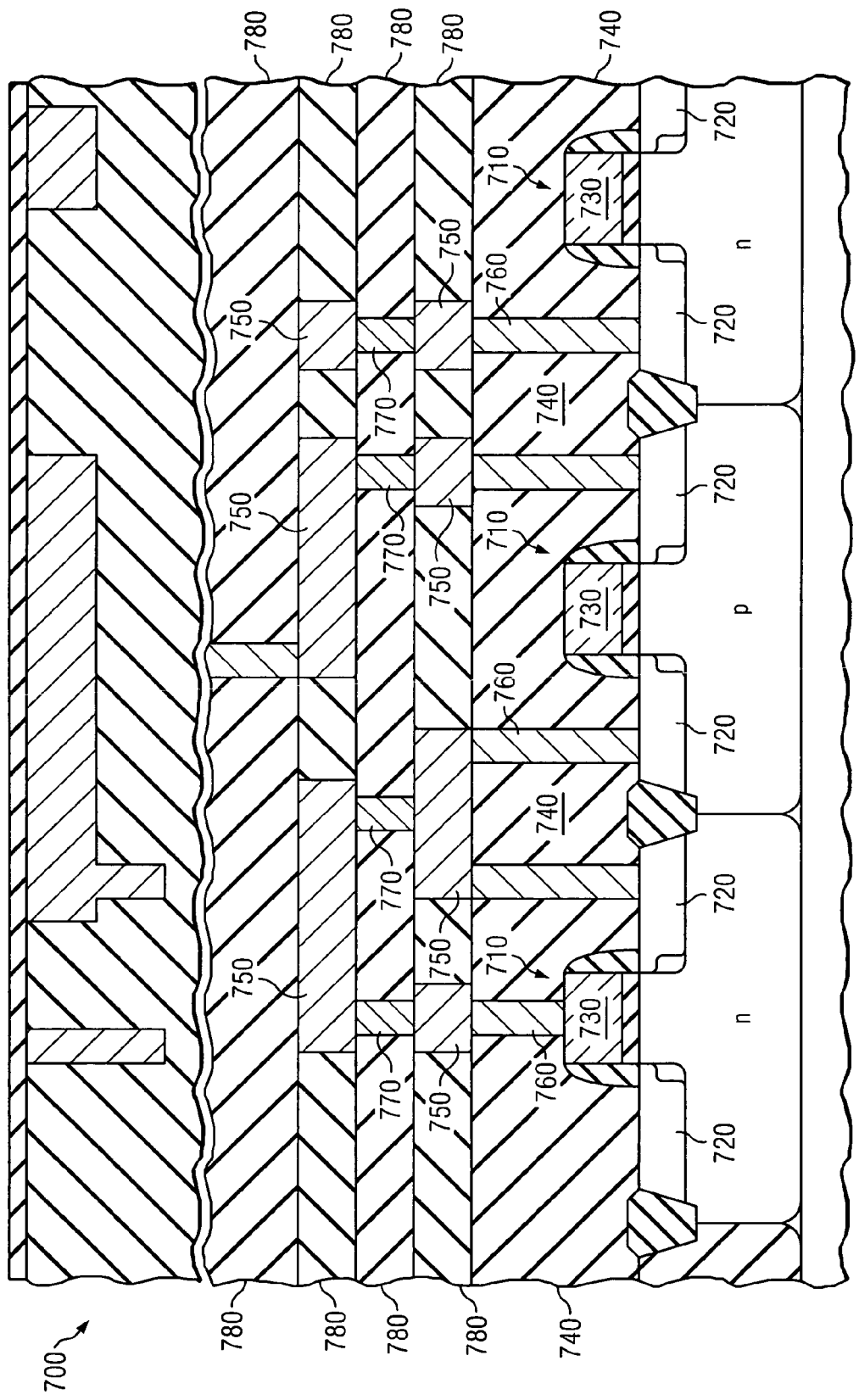
FIG. 7 illustrates a sectional view of a semiconductor interconnect manufactured according to the principles of the claimed invention.

Referring finally to FIG. 7, illustrated is a cross-sectional view of an integrated circuit (IC) 700 incorporating semiconductor devices 710, which comprise source/drain regions 720 and gates 730. Dielectric 740 separates semiconductor devices 710 from metal lines 750. Contacts 760 have been formed according to the principles of the claimed invention, and electrically couple semiconductor devices 710 to metal lines 750. Metal lines 750 are further connected with vias 770. Metal lines 750 and vias 770 may comprise copper, aluminum, or other metals and metallic compounds suitable for integrated circuit interconnects. Vias 770 may also comprise tungsten if appropriate to the interconnect technology used. The vias and metal traces are embedded in conventionally deposited dielectric 780, which may be single or multilayered, using one or more dielectric materials, including conventional dielectrics, low-k and ultra low-k materials, airgaps and barrier and etch stop dielectrics. The IC 700 may include devices, such as transistors used to form CMOS devices, BiCMOS devices, bipolar devices, capacitors or other types of devices. The IC 700 may further include passive devices, such as inductors or resistors, or it may also include optical devices or optoelectronic devices. Those skilled in the art are familiar with these various types of devices and their manufacture. Metal traces 750, vias 770 and contacts 760 are used to connect the various devices to form the operational IC 700.

The interconnect architecture of the IC 700 is exemplary of one that may be fabricated according to the principles of the invention. It will be apparent to one skilled in the art that several variations of the exemplary interconnect architecture may be fabricated according to the principles of the invention with similarly advantageous results.

Although the present invention has been described in detail, those skilled in the art should understand that they can make various changes, substitutions and alterations herein without departing from the spirit and scope of the invention in its broadest form.

What is claimed is:

1. A method for forming an interconnect, comprising:
    forming an opening in a dielectric layer;
    depositing a liner over an inner surface of the opening using a first liner material that forms a contaminated liner layer in a portion of said opening, the depositing forming a reentrant profile near a top portion of the opening; and
    etching a portion of the liner, including removing at least a portion of the liner to reduce the reentrant profile and removing at least a portion of the contaminated liner at the bottom of the opening,
    wherein the depositing and the etching are conducted simultaneously.

2. The method as recited in claim 1 wherein at least a portion of the liner located at the reentrant profile is deposited at the bottom of the opening.

3. The method as recited in claim 1 wherein the underlying layer is a silicide layer.

4. The method as recited in claim 1 wherein an etch is conducted prior to depositing the liner.

5. The method as recited in claim 1 wherein the method further includes depositing additional liner after the simultaneous depositing and etching.

6. The method as recited in claim 1 wherein the liner acts as a getter for contaminants located at the bottom of the opening.

7. The method as recited in claim 6 wherein the liner comprises a material selected from the group consisting of: Ti, Ta, Ru, Ir.

8. The method as recited in claim 1 wherein the method further includes forming a barrier over the liner and forming a contact plug over the barrier and within the opening.

9. The method as recited in claim 8 wherein the barrier has a thickness ranging from about 1 nm and about 4 nm, and comprises a material selected from the group consisting of TiN, TaN, TiCN, TaCN, MoN, WN, TiSiN, TaSiN, WSiN, MoSiN, MoCN and WCN.

10. The method as recited in claim 8 wherein the barrier comprises a material selected from the group consisting of Ta, Ru and Ir.

11. The method as recited in claim 8 wherein the barrier comprises a material selected from the group consisting of Rh, Pd, Os, and Pt.

12. The method as recited in claim 1 wherein a lower wafer bias power is used to form an isotropic etch to remove a portion of the liner at the reentrant profile.

13. The method as recited in claim 12 wherein a DC target power of the etching ranges from about 5 kW to about 15 kW, and a wafer AC bias power of the etching ranges from about 100 Watts and 500 Watts.

14. The method as recited in claim 13 wherein an RF coil power of the etch ranges from about 200 Watts and about 1500 Watts.

15. A method for manufacturing an integrated circuit, comprising:
   forming transistors over a semiconductor substrate;
   forming a first dielectric layer over the transistors;
   forming an opening in a dielectric layer;
   simultaneously depositing and etching a first liner over an inner surface of the opening;
   the simultaneous depositing and etching of said liner layer being performed by a PVD process with a DC target power from about 5 kW to about 15 kW, and a wafer AC bias power from about 100 Watts and 500 Watts;
   forming additional dielectric layers over the first dielectric layer; and
   forming interconnects in the first dielectric layer and the additional dielectric layers to interconnect the transistors and thereby form an operative integrated circuit.

16. The method as recited in claim 15 wherein the method further includes depositing a second liner over said first liner.

17. The method as recited in claim 16 wherein the method further includes forming a barrier over the second liner and forming a contact plug over the barrier and within the opening.

18. The method as recited in claim 15 wherein the method further includes forming a barrier over the first liner and forming a contact plug over the barrier and within the opening.

19. The method as recited in claim 18 wherein the barrier has a thickness ranging from about 1 nm and about 4 nm, and comprises a material selected from the group consisting of TiN, TaN, TiCN, TaCN, MoN, WN, TiSiN, TaSiN, WSiN, MoSiN, MoCN and WCN.

20. The method as recited in claim 18 wherein the barrier comprises a material selected from the group consisting of Ta, Ir and Ru.

21. The method as recited in claim 18 wherein the barrier comprises a material selected from the group consisting of Rh, Pd, Os, and Pt.

* * * * *